(12) United States Patent
Kienle et al.

(10) Patent No.: US 11,387,108 B2
(45) Date of Patent: Jul. 12, 2022

(54) COMPOSITION FOR METAL ELECTROPLATING COMPRISING LEVELING AGENT

(71) Applicant: BASF SE, Ludwigshafen am Rhein (DE)

(72) Inventors: Marcel Patrik Kienle, Limburgerhof (DE); Cornelia Roeger-Goepfert, Ludwigshafen (DE); Dieter Mayer, Ludwigshafen (DE); Marco Arnold, Ludwigshafen (DE); Alexander Fluegel, Ludwigshafen (DE); Charlotte Emnet, Ludwigshafen (DE)

(73) Assignee: BASF SE, Ludwigshafen am Rhein (DE)

( * ) Notice: Subject to any disclaimer, the term of this patent is extended or adjusted under 35 U.S.C. 154(b) by 72 days.

(21) Appl. No.: 16/638,318

(22) PCT Filed: Aug. 31, 2018

(86) PCT No.: PCT/EP2018/073450
§ 371 (c)(1),
(2) Date: Feb. 11, 2020

(87) PCT Pub. No.: WO2019/043146
PCT Pub. Date: Mar. 7, 2019

(65) Prior Publication Data
US 2020/0185224 A1   Jun. 11, 2020

(30) Foreign Application Priority Data

Sep. 4, 2017 (EP) .................................. 17189140

(51) Int. Cl.
*H01L 21/288* (2006.01)
*C25D 3/38* (2006.01)
(Continued)

(52) U.S. Cl.
CPC ............ *H01L 21/2885* (2013.01); *C25D 3/38* (2013.01); *C25D 5/02* (2013.01); *C25D 7/123* (2013.01)

(58) Field of Classification Search
CPC .................................................. C25D 3/38–40
See application file for complete search history.

(56) References Cited

U.S. PATENT DOCUMENTS 4,450,045 A      5/1984  Hertel et al.
6,425,996 B1 *   7/2002  Dahms ............... C08G 73/0286
                                                           205/291
(Continued)

FOREIGN PATENT DOCUMENTS

DE       197 58 121 A1      7/1999
DE       102005049789 A1 *  4/2007 ............. C25D 3/565
(Continued)

OTHER PUBLICATIONS

Heidenfelder et al., Machine Translation, DE 102005049789 A1. (Year: 2005).*
(Continued)

*Primary Examiner* — Harry D Wilkins, III
*Assistant Examiner* — Ho-Sung Chung
(74) *Attorney, Agent, or Firm* — Armstrong Teasdale LLP

(57) ABSTRACT

A composition for metal plating comprising a source of metal ions and at least one leveling agent comprising at least one polyaminoamide comprising a polymer fragment of formula (I) or derivatives thereof obtainable by complete or partial protonation or N-quarternisation.

(Continued)

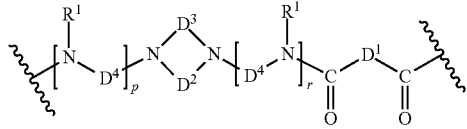

(I)

17 Claims, 1 Drawing Sheet

(51) Int. Cl.
*C25D 5/02* (2006.01)
*C25D 7/12* (2006.01)

(56) References Cited

U.S. PATENT DOCUMENTS

| 2004/0045832 | A1* | 3/2004 | Martyak | C25D 3/38 |
| | | | | 205/131 |
| 2005/0067297 | A1* | 3/2005 | Tench | C25D 3/58 |
| | | | | 205/296 |
| 2012/0292193 | A1 | 11/2012 | Roeger-Goepfert et al. | |
| 2014/0097092 | A1 | 4/2014 | Roeger-Goepfert et al. | |
| 2015/0284865 | A1 | 10/2015 | Kienle et al. | |

FOREIGN PATENT DOCUMENTS

| EP | 0 074 558 A2 | 3/1983 |
| WO | WO 2010/069810 A1 | 6/2010 |
| WO | WO 2010/115717 A1 | 10/2010 |
| WO | WO 2010/115756 A1 | 10/2010 |
| WO | WO 2010/115757 A1 | 10/2010 |
| WO | WO 2010/115796 A1 | 10/2010 |
| WO | WO 2011/012462 A2 | 2/2011 |
| WO | WO 2011/012475 A1 | 2/2011 |
| WO | WO 2011/064154 A2 | 6/2011 |
| WO | WO 2011/151785 A1 | 12/2011 |
| WO | WO 2012/085811 A1 | 6/2012 |
| WO | WO 2014/072885 A2 | 5/2014 |
| WO | WO 2018/073011 A1 | 4/2018 |
| WO | WO 2018/114985 A1 | 6/2018 |

OTHER PUBLICATIONS

International Search Report dated Nov. 6, 2018 in PCT/EP2018/073450 filed Aug. 31, 2018.

\* cited by examiner

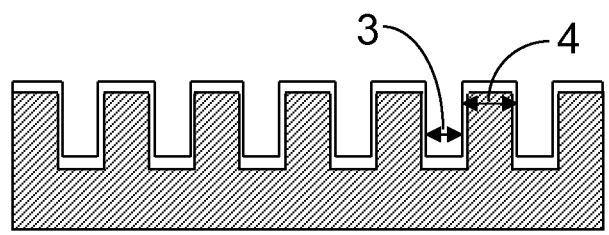

COMPOSITION FOR METAL ELECTROPLATING COMPRISING LEVELING AGENT

The present invention relates to a composition for metal plating, particularly copper electroplating, comprising metal ions and a polyaminoamide type leveling agent.

BACKGROUND OF THE INVENTION

Filling of small features, such as vias and trenches, by copper electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the copper lines.

One class of additives are the so-called levelers. Levelers are used to provide a substantially planar surface over the filled features. In literature, a variety of different leveling compounds has been described. In most cases, leveling compounds are N-containing and optionally substituted and/or quaternized polymers, such as polyethylene imine, polyglycine, poly(allylamine), polyaniline (sulfonated), polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, polyalkoxylated polyamides and polyalkanolamines.

U.S. Pat. No. 6,425,996 B1 discloses leveling agents comprising the reaction product of polyaminoamides and epihalohydrins, dihalohydrins and 1-halogen-2,3-propanediols, respectively.

US 2012/292193 A discloses leveling agents comprising polyaminoamides, alkoxylated polyaminoamides, functionalized polyaminoamides, and functionalized and alkoxylated polyaminoamides. US 2014/097092 A discloses aromatic PAAs for use in through silicon via copper electrodeposition application. In WO 2014/072885 polyaminoamides are described which may be obtained by reacting at least one diamine with at least one N,N'-bisacrylamide.

It is an object of the present invention to provide a metal, particularly copper electroplating additive having good leveling properties, in particular leveling agents capable of providing a substantially planar copper layer and filling features on the nanometer and on the micrometer scale without substantially forming defects, such as but not limited to voids, with a metal electroplating bath, preferably a copper electroplating bath.

SUMMARY OF THE INVENTION

Surprisingly, it has now been found, that the use of particular polyaminoamides based on cyclic amines show extraordinary leveling properties.

Therefore, the present invention provides a composition comprising metal ions and at least one leveling agent of formula I

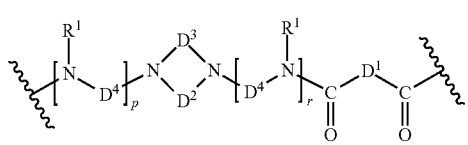

(I)

or derivatives thereof obtainable by complete or partial protonation or N-quarternisation,
wherein
$D^1$ is selected from a chemical bond or a divalent group selected from $C_1$-$C_{20}$-alkanediyl which may optionally be interrupted by a double bond, an imino group or is optionally, completely or partially, a constituent of one or more saturated or unsaturated carbocyclic 5- to 8-membered rings,
$D^2$, $D^3$ are independently selected from (a) linear or branched $C_1$-$C_{12}$ alkanediyl, which may optionally be interrupted by O, S and $NR^{10}$, (b) are both, together with the two N atoms, part of a 5 or 6-membered aromatic ring system,
$D^4$ is, for each repeating unit 1 to p or r independently, selected from a linear or branched $C_1$-$C_{12}$ alkanediyl, which may optionally be interrupted by O or S,
$R^1$ is, for each repeating unit 1 to p and r independently, selected from H, —O—$(CR^{11}R^{12}$—O$)_q$—H, $C_1$-$C_{12}$-alkyl, and $C_1$ to $C_{15}$ arylalkyl, which alkyl or arylakyl may optionally be substituted by hydroxy or $C_1$ to $C_{10}$ alkoxy,
$R^{10}$ is selected from H and $C_1$-$C_{12}$ alkyl, which may optionally be substituted by hydroxy and $C_1$ to $C_{10}$ alkoxy,
$R^{11}$, $R^{12}$ are each independently selected from H, $C_1$-$C_{10}$ alkyl and —$CH_2$—O—$R^{15}$,
$R^{15}$ is selected from H and $C_1$-$C_{10}$ alkyl,
p, r are independently integers from 0 to 10, and
q is an integer selected so that the average degree of alkoxylation of the leveling agent is from 0.01 to 5.

The invention further relates to the use of a polyaminoamide of formula I or derivatives thereof obtainable by complete or partial protonation or N-quarternisation in a bath for depositing copper containing layers on semiconductor substrates.

The invention further relates to a process for depositing a metal layer on a substrate comprising nanometer-sized features by
a) contacting a composition as defined herein with the substrate, and
b) applying a current density to the substrate for a time sufficient to deposit a metal layer onto the substrate,
wherein the substrate comprises nanometer sized features and the deposition is performed to fill the micrometer or nanometer sized features.

It has been found that the use of compositions according to the present invention for electroplating provides deposited metal layers, particularly copper layers, having reduced overplating, particularly reduced mounding. The leveling agents according to the present invention are particularly useful for filling of small features, particularly those having aperture sizes of 30 nanometer or below.

The metal layers provided by the present invention are substantially planar, even on substrates exhibiting apertures of a very wide range of different aperture sizes (scale: about 1 nanometer to about 2 micrometers). Furthermore, it has been found that the present invention provides metal layers substantially without the formation of added defects, such as voids, in the features.

Polyaminoamides comprising cyclic amines exhibit an especially efficient leveling property even at small concentrations in the plating bath. This is beneficial regarding potential impact of the leveling agent on the filling process of the different apertures on the substrate. Generally, leveling agents might have an influence on the filling rate and on the defectivity of the apertures. Preferably, the leveling agents essentially do not interfere with the superfilling of the features.

Generally it is desired to have leveling agents that provide metal deposits comprising low content of other elements than the desired metal present in the plating bath during the metal deposition. Small amounts of leveling agent in the plating bath are beneficial and help to reduce the impact of the leveling agent on the purity of the deposited metal film.

A further significant advantage of this leveling effect is that less material has to be removed in post-deposition operations. For example, chemical mechanical polishing (CMP) is used to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects.

Yet another advantage of the present invention is that it helps to reduce the impact of the leveling agent on the superfilling process and helps to improve the quality of the deposited metal. It also helps to preserve resources.

Amino acids can be used as educts in the presented synthesis route which allows a flexible and simple synthesis of the leveling agents.

BRIEF DESCRIPTION OF THE FIGURES

FIG. 1 shows a scheme of a substrate to be electroplated according to Example B.

DETAILED DESCRIPTION OF THE INVENTION

Levelers According to the Invention

It has been found, that polyaminoamides comprising particular cyclic structures can be used as leveling agents in metal, particularly in copper electroplating baths showing an improved leveling performance.

As used herein, "leveling agent", "leveler" and "polyaminoamide" are used synonymously.

Polyaminoamides are generally known to be polymers whose backbone chain contains both amino functionalities (NH) and amide functionalities (NH—C(O)). They are obtainable by reacting polyalkylenepolyamines with dicarboxylic acids, preferably in a molar ratio of 1:0.5 to 1:2. In general polyaminoamides are linear or branched. Linear polyaminoamides are preferred. Polyaminoamides may be polymers of the formula I as defined herein.

Besides metal ions the metal electroplating composition comprises at least one compound of formula I:

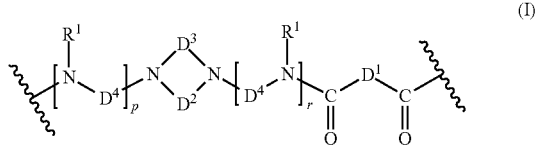

(I)

Such compounds, in the following also referred to as "leveling agent" or "leveler", is generally obtainable by reacting a cyclic multiamine compound with a diacid.

Generally, $D^1$ is selected from a chemical bond or a divalent group selected from $C_1$-$C_{12}$-alkanediyl which may optionally be interrupted by an imino group or is optionally, completely or partially, a constituent of one or more saturated, unsaturated or aromatic carbocyclic or heterocyclic 5- to 8-membered rings.

As used herein, "chemical bond" means that the respective moiety is not present but that the adjacent moieties are bridged so as to form a direct chemical bond between these adjacent moieties. By way of example, if in X—Y—Z the moiety Y is a chemical bond then the adjacent moieties X and Z together form a group X—Z.

In a preferred embodiment $D^1$ is selected from a divalent group selected from $C_1$-$C_{20}$-alkanediyl which may optionally be interrupted by a double bond and an imino group. More preferably $D^1$ is selected from ethanediyl, propanediyl, butanediyl, pentanediyl, hexanediyl, heptanediyl, octanediyl, nonanediyl, or decanediyl. Most preferably $D^1$ is selected from ethanediyl, 1,3 propanediyl, 1,4 butanediyl, and 1,6 hexanediyl.

In another preferred embodiment, $D^1$ is a saturated, unsaturated or aromatic 5- to 10-membered ring. More preferably $D^1$ is a $C_5$ to $C_{10}$ aryl or heteroaryl diradical. Most preferably selected from phenyl or pyridyl diradicals.

In one alternative, $D^2$ and $D^3$ are independently selected from linear or branched $C_1$-$C_{12}$ alkanediyl, which may optionally be interrupted by 0, S and $NR^{10}$, with $R^{10}$ being selected from H and $C_1$-$C_{20}$ alkyl, which may optionally be substituted by hydroxy or $C_1$ to $C_{10}$ alkoxy.

In another alternative $D^2$ and $D^3$ are both, together with the adjacent two N atoms, part of a 5 or 6-membered heteroaromatic ring system. In a particularly preferred embodiment $D^2$ and $D^3$, together with the two N atoms, form an imidazole ring.

In a preferred embodiment $D^2$ and $D^3$ are independently selected from linear or branched $C_1$-$C_8$ alkanediyl, which may optionally be interrupted by 0 and $NR^{10}$. In a particularly preferred embodiment $D^2$ and $D^3$ are independently selected from linear or branched $C_1$ to $C_6$ alkanediyl. Even more preferably $D^2$ and $D^3$ are selected from $(CH_2)_g$, wherein g is an integer from 1 to 6, preferably 1 to 3. Most preferably $D^2$ and $D^3$ are both ethanediyl, or $D^2$ is methanediyl and $D^3$ is propanediyl.

If present, $R^{10}$ is preferably selected from H and $C_1$-$C_{10}$ alkyl, more preferably from H and $C_1$-$C_4$ alkyl, most preferably from H and methyl or ethyl.

Generally, $D^4$ is selected from a linear or branched $C_1$-$C_{12}$ alkanediyl, which may optionally be interrupted by O or S. In a particularly preferred embodiment $D^4$ is selected from linear or branched $C_2$ to $C_6$ alkanediyl. Even more preferably $D^4$ is selected from $(CH_2)_g$, wherein g is an integer from 1 to 8, preferably 2 to 6. Most preferably $D^4$ is selected from ethanediyl, propanediyl, butanediyl or hexanediyl. $D^4$ may be selected independently for each repeating unit p and r even if it is preferred that $D^4$ is the same for all repeating units p and r.

$R^1$ may be selected from H, —O—$(CR^{11}R^{12}$—O$)_q$—H, $C_1$-$C_{12}$-alkyl, and $C_1$ to $C_{15}$ arylalkyl, which alkyl and arylalkyl may optionally be substituted by hydroxy or $C_1$ to $C_{10}$ alkoxy, with q being an integer selected so that the average degree of alkoxylation is from 0.01 to 5. $R^1$ may be selected independently for each repeating unit 1 to p and r. Herein $R^{11}$ and $R^{12}$ are independently selected from H, $C_1$-$C_{10}$ alkyl, and —$CH_2$—O—$R^{15}$, wherein $R^{15}$ is selected from H and $C_1$-$C_{10}$ alkyl.

As used herein "average degree of alkoxylation" or "average number of alkoxylation" means the number of alkoxy groups per N—H groups averaged over all polyoxyalkylene units in the polyaminoamide polymer. Referring to formula Ia and Ib below, it is averaged over all polymeric units 1 to j or g+h, e.g. an average degree of alkoxylation of 2 means that there are in average 2 alkoxy group per N—H groups in the whole polymer.

In a preferred embodiment $R^{11}$ and $R^{12}$ are both H.

In another preferred embodiment $R^{11}$ is H and $R^{12}$ is methyl or ethyl. Such polyoxyalkylene substitution may be prepared by reacting ethylene oxide with propylene oxide or butylene oxide. The copolymers received may have block, random or alternating structure.

As used herein, "random" means that the respective comonomers are polymerized from a mixture and therefore arranged in a statistically manner depending on their copoymerization parameters.

As used herein, "block" means that the respective comonomers are polymerized after each other to form blocks of the respective co-monomers in any predefined order. By way of example, for ethylene oxide (EO) and propylene oxide (PO) comonomers such blocks may be, but are not limited to: -$EO_x$—$PO_y$, —$PO_x$-$EO_y$, -$EO_x$—$PO_y$-$EO_x$, —$PO_x$-$EO_y$—$PO_x$, etc.

In one embodiment $R^1$ is H.

In another embodiment, if $R^1$ is not H, the polyaminoamides may be further functionalized by (poly)alkoxylation, alkylation or alkenylation. Preferred (poly)alkoxy substituents $R^1$ are those in which $R^{11}$ is H, $R^{12}$ is H, methyl or ethyl, and q is from 0.1 to 3, most preferred from 0.5 to 2. It is also possible to prepare polyalkyleneoxide copolymers, preferable poly(oxyethylene-co-oxypropylene). Preferred alkyl-substituted polyaminoamides are linear or branched, preferably linear $C_1$ to $C_6$ alkyl, most preferred methyl, ethyl, propyl or butyl.

Generally, p and r may be integers from 0 to 10. In a preferred embodiment p, r, or both p and r are 0. This may be realized by starting from a cyclic diamine bearing NH groups, such as but not limited to piperazin. With p and/or r being 0 the cyclic amino compound can be directly bonded to the carbonyl function of the amide group.

In another preferred embodiment p, r, or both p and r are integers from 1 to 6, preferably integers from 1 to 4, most preferably 1 or 2. In yet another embodiment, either p or r is 0 and the other is 1 to 4.

The term "$C_x$" means that the respective group comprises x numbers of C atoms. The term "$C_x$ to $C_y$ alkyl" means alkyl with a number x to y of carbon atoms and includes linear, branched and cyclic alkyl. "Substituted alkyl" means that one or more of the hydrogens on the alkyl group is replaced with another substituent group, such as, but not limited to, cyano, hydroxy, halo, ($C_1$-$C_6$)alkoxy, ($C_1$-$C_6$)alkylthio, thiol, nitro, and the like.

In a particular embodiment the at least one polyaminoamide is selected from formula Ia or Ib

or derivatives thereof obtainable by complete or partial protonation or N-quarternisation, wherein
A is the polymer fragment of formula I as defined above,
B is a polymer fragment of formula II

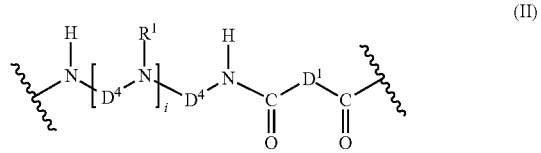

$D^1$, $D^4$, $R^1$ have independently the prescribed meanings,
$E^1$, $E^2$ are independently selected from
(a) H or a nucleophilically displaceable leaving group X,
(b) NH—$C_1$-$C_{20}$-alkyl, or N—($C_1$-$C_{20}$-alkyl)$_2$
(c) H—{NH-[$D^4$-$NR^1$]$_k$-$D^4$-NH} or $R^1$—{$NR^1$-[$D^4$-$NR^1$]$_k$-$D^4$-NH},
(d) $C_1$-$C_{20}$-alkyl-CO—{NH-[$D^4$-$NR^1$]$_k$-$D^4$-NH}, and
g, h are integers from 1 to 250,
k is an integer from 1 to 10,
i is an integer from 0 to 10, preferably 0 or 1 to 3.

In another preferred embodiment $D^1$ is selected from a chemical bond or a $C_1$-$C_{20}$-alkanediyl group, $D^2$ and $D^3$ are independently selected from ($CH_2$)$_m$ with m being 1 to 6, R' is selected from H or methyl, $E^1$, $E^2$ are independently selected from H, OH, alkoxy, halogen, H—{NH-[$D^4$-$NR^1$]$_k$-$D^4$-NH} or $R^1$—{$NR^1$-[$D^4$-$NR^1$-]$_k$-$D^4$-NH}, k is 1 or 2, and g and h are integers from 5 to 100.

As used herein, "alkanediyl" refers to a diradical of linear or branched, acyclic or cyclic alkanes.

"Overplating" refers to a thicker metal deposit over the feature as compared to areas free of features. Insofar the additives according to the present inventions act as "leveler". "Dense feature areas" means an area exhibiting smaller distances between neighboring features compared to a comparative area containing apertures with a relatively large distance in between. Smaller distances means distances below 2 micrometer, and preferably below 1 micrometer, and even more preferably below 500 nm. Such difference in the plating thickness over dense feature areas as compared to the plating thickness over areas free of features or containing relatively few features is referred to as "step height" or "mounding "Aspect ratio" means the ratio of the depth of the feature to the opening diameter or width of the feature. The aperture size according to the present invention means the smallest diameter or free distance of a feature before plating, i.e. after metal seed deposition. The terms "aperture", "opening" or width are used herein synonymously.

Multiamines useful to prepare the leveling agents are aminoethylpiperazine, 1,4-bis (3-aminopropyl) piperazine, N-(2-aminoethyl) piperazine, mixtures thereof, and mixtures with non-cyclic polyalkylenepolyamines having at least 3 amino groups.

Dicarboxylic acids which are particularly useful to prepare the leveling agents are oxalic acid (ethanedioic acid), malonic acid (propanedioic acid), succinic acid (butanedioic acid), tartaric acid (2,3-dihydroxybutanedioic acid), maleic acid ((Z)-butenedioic acid), itaconic acid (2-methylidenebutanedioic acid), glutaric acid (pentanedioic acid), adipic acid (hexanedioic acid), suberic acid (octanedioic acid), sebacic acid (decanedioic acid), iminodiacetic acid, aspartic acid (2-aminobutanedioic acid), glutamic acid, and mixtures thereof.

Generally, the molecular weight $M_w$ of the leveling agent may be from about 500 to about 100000 g/mol, preferably 1000 to 80000 g/mol, most preferably 5000 to 50000 g/mol.

The dicarboxylic acids can be used in the form of the free acids or as carboxylic acid derivatives, such as anhydrides, esters, amides or acid halides, in particular chlorides. Examples of such derivatives are anhydrides, such as maleic anhydride, succinic anhydride, phthalic anhydride and itaconic anhydride; adipic dichloride; esters with, preferably, $C_1$-$C_2$-alcohols, such as dimethyl adipate, diethyl adipate, dimethyl tartrate and dimethyl iminodiacetate; amides, such as adipic acid diamide, adipic acid monoamide and glutaric acid diamide. Preference is given to using the free carboxylic acids or the carboxylic acid anhydrides.

The polycondensation of the polyamine and of the dicarboxylic acid usually takes place by heating the polyamine and the dicarboxylic acid, e.g. to temperatures of from 100 to 250 degrees C., preferably 120 to 200 degrees C., and distilling off the water of reaction which forms in the condensation. If said carboxylic acid derivatives are used, the condensation can also be carried out at temperatures lower than those given. The preparation of the polyaminoamides can be carried out without the addition of a catalyst, or alternatively with the use of an acidic or basic catalyst. Suitable acidic catalysts are, for example, acids, such as Lewis acids, e.g. sulfuric acid, p-toluenesulfonic acid, phosphorous acid, hypophosphorous acid, phosphoric acid, methanesulfonic acid, boric acid, aluminum chloride, boron trifluoride, tetraethyl orthotitanate, tin dioxide, tin butyldilaurate or mixtures thereof. Suitable basic catalysts are, for example, alkoxides, such as sodium methoxide or sodium ethoxide, alkali metal hydroxides, such as potassium hydroxide, sodium hydroxide or lithium hydroxide, alkaline earth metal oxides, such as magnesium oxide or calcium oxide, alkali metal and alkaline earth metal carbonates, such as sodium, potassium and calcium carbonate, phosphates, such as potassium phosphate and complex metal hydrides, such as sodium borohydride. Where used, the catalyst is generally used in an amount of from 0.05 to 10% by weight, preferably 0.5 to 1% by weight, based on the total amount of the starting materials.

The reaction can be carried out in a suitable solvent or preferably in the absence of a solvent. If a solvent is used, suitable examples are hydrocarbons, such as toluene or xylene, nitriles, such as acetonitrile, amides, such as N,N-dimethylformamide, N,N-dimethylacetamide, N-methylpyrrolidone, ethers, such as diethylene glycol dimethyl ether, ethylene glycol dimethyl ether, ethylene carbonate, propylene carbonate and the like. The solvent is generally distilled off during the reaction or when the reaction is complete. This distillation can optionally be carried out under a protective gas, such as nitrogen or argon.

The secondary and primary amino groups present in the polyaminoamide can be protonated or quaternized by means of suitable protonating or alkylating agents. This would be possible for all groups $R^1$ in formula I or II, if p, r or j are 2 or higher, since otherwise only amido groups are present in the polyaminoamide. Examples for suitable alkylating agents are organic compounds which contain active halogen atoms, such as the aralkyl halides, the alkyl, alkenyl and alkynyl halides, and the like. Additionally, compounds such as the alkyl sulphates, alkyl sultones, epoxides, alkyl suphites, dialkyl carbonates, methyl formiate and the like may also be used. Examples of corresponding alkylating agents comprise benzyl chloride, propane sultone, dimethyl sulphate, dimethyl sulphite, dimethyl carbonate, (3-chloro-2-hydroxypropyl)trimethylammonium chloride, or the like. Preference is given to using dimethyl sulphate and/or benzyl chloride, particularly dimethylsulphate.

In general, the total amount of leveling agents in the electroplating bath is from 0.05 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

Plating Bath

A wide variety of metal plating baths may be used with the present invention. Metal electroplating baths typically contain a metal ion source, an electrolyte, and the leveling agent.

The metal ion source may be any compound capable of releasing metal ions to be deposited in the electroplating bath in sufficient amount, i.e. is at least partially soluble in the electroplating bath. Suitable metal ions include, but are not limited to, tin, silver (optionally in combination with tin), copper, and cobalt. In a preferred embodiment, the metal comprises or consist of copper or cobalt. A particularly preferred metal comprises or consists of copper.

It is preferred that the metal ion source is soluble in the plating bath to release 100% of the metal ions. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of copper ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate.

If the metal is copper, it is typically present in an amount in the range of from about 1 to about 300 g/l of the plating solution. Generally the leveling agent is useful in low copper, medium copper and high copper baths. Low copper means a copper concentration from about 1 to about 20 g/l.

Also mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, besides the metal ions and at least one of the leveling agent agents according to the present invention the present metal electroplating compositions preferably include an electrolyte, typically an acidic or alkaline electrolyte, one or more sources of metal ions, optionally halide ions, and optionally other additives like accelerators and/or suppressors. Such baths are typically aqueous. The water may be present in a wide range of amounts. Any type of water may be used, such as distilled, deionized or tap.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/l. The plating bath may be a high, a medium or a low acid bath. Low acid baths usually comprise one or more acids in a concentration below 15 g/l. The pH of the acidic plating bath is usually below 5, preferably below 4, even more preferably below 3, most preferably below 2. Alkaline electrolytes are typically present in an amount of about 0.1 to about 20 g/l or to yield a pH of 8 to 13 respectively, and more typically to yield a pH of 9 to 12.

Such electrolytes may optionally contain a source of halide ions, such as chloride ions as in metal chloride, preferably copper chloride, or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

In a particular embodiment the levelers of this invention may be used in low copper electrolyte compositions typically containing about below 20 g/l copper ions, in combination with typically about 2-15 g/l acid like sulfuric acid and with halide ions typically in the range of about 10-400 ppm by weight, preferably with chloride ions.

Other Additives

The electroplating baths according to the present invention may include one or more optional additives. Such optional additives include, but are not limited to, accelerators, suppressors, further leveling agents, surfactants and the like.

Any accelerators may be advantageously used in the plating baths according to the present invention. As used herein, "accelerator" refers to an organic additive that increases the plating rate of the electroplating bath. The terms "accelerator" and "accelerating agent" are used interchangeably throughout this specification. In literature, sometimes the accelerator component is also named "brightener", "brightening agent", or "depolarizer". Accelerators useful in the present invention include, but are not limited to, compounds comprising one or more sulphur atom and a sulfonic/phosphonic acid or their salts. Preferably the composition further comprises at least one accelerating agent.

Preferred accelerators have the general structure $MO_3X-R^{21}-(S)_dR^{22}$, with:

M is a hydrogen or an alkali metal (preferably Na or K)
X is P or S
d=1 to 6
$R^{21}$ is selected from $C_1$-$C_8$ alkyl group or heteroalkyl group, an aryl group or a heteroaromatic group. Heteroalkyl groups will have one or more heteroatom (N, S, O) and 1-12 carbons. Carbocyclic aryl groups are typical aryl groups, such as phenyl, naphtyl. Heteroaromatic groups are also suitable aryl groups and contain one or more N, O or S atom and 1-3 separate or fused rings.

$R^{22}$ is selected from H or ($-S-R^{21'}XO_3M$), with $R^{21'}$ being identical or different from $R^{21}$.

More specifically, useful accelerators include those of the following formulae:

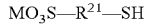

$MO_3S-R^{21}-SH$

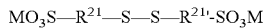

$MO_3S-R^{21}-S-S-R^{21'}-SO_3M$

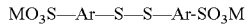

$MO_3S-Ar-S-S-Ar-SO_3M$ with $R^{21}$ is as defined above and Ar is Aryl.

Particularly preferred accelerating agents are:
SPS: bis-(3-sulfopropyl)-disulfide disodium salt
MPS: 3-mercapto-1-propansulfonic acid, sodium salt
Other examples of accelerators, used alone or in mixture, include, but are not limited to: MES (2-Mercaptoethanesulfonic acid, sodium salt); DPS (N,N-dimethyldithiocarbamic acid (3-sulfopropylester), sodium salt); UPS (3-[(amino-iminomethyl)-thio]-1-propylsulfonic acid); ZPS (3-(2-benzthiazolylthio)-1-propanesulfonic acid, sodium salt); 3-mercapto-propylsulfonicacid-(3-sulfopropyl)ester; methyl-(ω-sulphopropyl)-disulfide, disodium salt; methyl-(ω-sulphopropyl)trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Particularly useful suppressing agents in combination with the levelers according to the present inventions are:

(a) Suppressing agents obtainable by reacting an amine compound comprising at least three active amino functional groups with a mixture of ethylene oxide and at least one compound selected from $C_3$ and $C_4$ alkylene oxides as described in WO 2010/115796.

Preferably the amine compound is selected from diethylene triamine, 3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

(b) Suppressing agents obtainable by reacting an amine compound comprising active amino functional groups with a mixture of ethylene oxide and at least one compound selected from $C_3$ and $C_4$ alkylene oxides, said suppressing agent having a molecular weight $M_w$ of 6000 g/mol or more, forming an ethylene $C_3$ and/or $C_4$ alkylene random copolymer as described in WO 2010/115756.

(c) Suppressing agent obtainable by reacting an amine compound comprising at least three active amino functional groups with ethylene oxide and at least one compound selected from $C_3$ and $C_4$ alkylene oxides from a mixture or in sequence, said suppressing agent having a molecular weight $M_w$ of 6000 g/mol or more as described in WO 2010/115757.

Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxyatridecane-1,13-diamine, triethylene glycol diamine, diethylene triamine, (3-(2-aminoethyl)aminopropylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

(d) Suppressing agent selected from compounds of formula S1

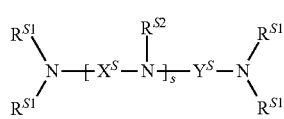 (S1)

wherein the $R^{S1}$ radicals are each independently selected from a copolymer of ethylene oxide and at least one further $C_3$ to $C_4$ alkylene oxide, said copolymer being a random copolymer, the $R^{S2}$ radicals are each independently selected from $R^{S1}$ or alkyl, $X^S$ and $Y^S$ are spacer groups independently, and $X^S$ for each repeating unit independently, selected from $C_2$ to $C_6$ alkandiyl and $Z^S$—$(O$—$Z^S)_t$ wherein the $Z^S$ radicals are each independently selected from $C_2$ to $C_6$ alkandiyl, s is an integer equal to or greater than 0, and t is an integer equal to or greater than 1, as described in WO 2010/115717.

Preferably spacer groups $X^S$ and $Y^S$ are independently, and $X^S$ for each repeating unit independently, selected from $C_2$ to $C_4$ alkylene. Most preferably $X^S$ and $Y^S$ are independently, and $X^S$ for each repeating unit independently, selected from ethylene (—$C_2H_4$—) or propylene (—$C_3H_6$—).

Preferably $Z^S$ is selected from $C_2$ to $C_4$ alkylene, most preferably from ethylene or propylene.

Preferably s is an integer from 1 to 10, more preferably from 1 to 5, most preferably from 1 to 3. Preferably t is an integer from 1 to 10, more preferably from 1 to 5, most preferably from 1 to 3.

In another preferred embodiment the $C_3$ to $C_4$ alkylene oxide is selected from propylene oxide (PO). In this case EO/PO copolymer side chains are generated starting from the active amino functional groups The content of ethylene oxide in the copolymer of ethylene oxide and the further $C_3$ to $C_4$ alkylene oxide can generally be from about 5% by weight to about 95% by weight, preferably from about 30% by weight to about 70% by weight, particularly preferably between about 35% by weight to about 65% by weight.

The compounds of formula (S1) are prepared by reacting an amine compound with one ore more alkylene oxides. Preferably the amine compound is selected from ethylene diamine, 1,3-diaminopropane, 1,4-diaminobutane, 1,5-diaminopentane, 1,6-diaminohexane, neopentanediamine, isophoronediamine, 4,9-dioxadecane-1,12-diamine, 4,7,10-trioxatridecane-1,13-diamine, triethylene glycol diamine, diethylene triamine, (3-(2-aminoethyl)amino)propylamine, 3,3'-iminodi(propylamine), N,N-bis(3-aminopropyl)methylamine, bis(3-dimethylaminopropyl)amine, triethylenetetraamine and N,N'-bis(3-aminopropyl)ethylenediamine.

The molecular weight $M_w$ of the suppressing agent of formula S1 may be between about 500 g/mol to about 30000 g/mol. Preferably the molecular weight $M_w$ should be about 6000 g/mol or more, preferably from about 6000 g/mol to about 20000 g/mol, more preferably from about 7000 g/mol to about 19000 g/mol, and most preferably from about 9000 g/mol to about 18000 g/mol. Preferred total amounts of alkylene oxide units in the suppressing agent may be from about 120 to about 360, preferably from about 140 to about 340, most preferably from about 180 to about 300.

Typical total amounts of alkylene oxide units in the suppressing agent may be about 110 ethylene oxide units (EO) and 10 propylene oxide units (PO), about 100 EO and 20 PO, about 90 EO and 30 PO, about 80 EO and 40 PO, about 70 EO and 50 PO, about 60 EO and 60 PO, about 50 EO and 70 PO, about 40 EO and 80 PO, about 30 EO and 90 PO, about 100 EO and 10 butylene oxide (BuO) units, about 90 EO and 20 BO, about 80 EO and 30 BO, about 70 EO and 40 BO, about 60 EO and 50 BO or about 40 EO and 60 BO to about 330 EO and 30 PO units, about 300 EO and 60 PO, about 270 EO and 90 PO, about 240 EO and 120 PO, about 210 EO and 150 PO, about 180 EO and 180 PO, about 150 EO and 210 PO, about 120 EO and 240 PO, about 90 EO and 270 PO, about 300 EO and 30 butylene oxide (BuO) units, about 270 EO and 60 BO, about 240 EO and 90 BO, about 210 EO and 120 BO, about 180 EO and 150 BO, or about 120 EO and 180 BO.

(e) Suppressing agent obtainable by reacting a polyhydric alcohol condensate compound derived from at least one polyalcohol of formula (S2) $X^S(OH)_u$ by condensation with at least one alkylene oxide to form a polyhydric alcohol condensate comprising polyoxyalkylene side chains, wherein u is an integer from 3 to 6 and $X^S$ is an u-valent linear or branched aliphatic or cycloaliphatic radical having from 3 to 10 carbon atoms, which may be substituted or unsubstituted, as described in WO 2011/012462.

Preferred polyalcohol condensates are selected from compounds of formulae

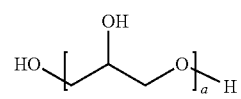 (S2a)

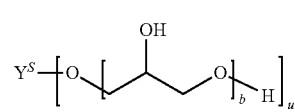 (S2b)

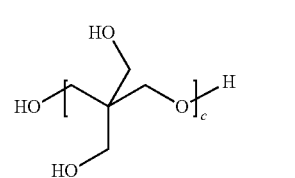 (S2c)

wherein $Y^S$ is an u-valent linear or branched aliphatic or cycloaliphatic radical having from 1 to 10 carbon atoms, which may be substituted or unsubstituted, a is an integer from 2 to 50, b may be the same or different for each polymer arm u and is an integer from 1 to 30, c is an integer from 2 to 3, and n is an integer from 1 to 6. Most preferred Polyalcohols are glycerol condensates and/or pentaerythritol condensates.

(f) Suppressing agent obtainable by reacting a polyhydric alcohol comprising at least 5 hydroxyl functional groups with at least one alkylene oxide to form a polyhydric alcohol comprising polyoxyalkylene side chains as described in WO 2011/012475. Preferred polyalcohols are linear or cyclic monosaccharide alcohols represented by formula (S3a) or (S3b)

 (S3a)

 (S3b)

wherein v is an integer from 3 to 8 and w is an integer form 5 to 10. Most preferred monosaccharide alcohols are sorbitol, mannitol, xylitol, ribitol and inositol. Further preferred polyalcohols are monosaccharides of formula (S4a) or (S4b)

$$CHO-(CHOH)_x-CH_2OH \quad (S4a)$$

$$CH_2OH-(CHOH)_y-CO-(CHOH)_z-CH_2OH \quad (S4b)$$

wherein x is an integer of 4 to 5, and y, z are integers and y+z is 3 or 4. Most preferred monosaccharide alcohols are selected from the aldoses allose, altrose, galactose, glucose, gulose, idose, mannose, talose, glucoheptose, mannoheptose or the ketoses fructose, psicose, sorbose, tagatose, mannoheptulose, sedoheptulose, taloheptulose, alloheptulose.

(g) amine-based polyoxyalkylene suppressing agents based on cyclic amines show extraordinary superfilling properties, particularly when used to fill in features having extremely small aperture sizes and/or high aspect ratios as described in unpublished European patent application No. 16194900.3.

(h) polyamine-based or polyhydric alcohol-based suppressing agents which are modified by reaction with a compound, such as but not limited to glycidole or glycerol carbonate, that introduce a branching group into the suppressing agent before they are reacted with alkylene oxides show extraordinary superfilling properties, particularly when used to fill in features having extremely small aperture sizes and/or high aspect ratios as described in unpublished European patent application No. 16205553.7.

These are particularly effective, strong suppressing agents that cope with the seed overhang issue and provide substantially defect free trench filling despite a non-conformal copper seed.

When suppressors are used, they are typically present in an amount in the range of from about 1 to about 10,000 ppm based on the weight of the bath, and preferably from about 5 to about 10,000 ppm.

It will be appreciated by those skilled in the art that more than one leveling agent may be used. When two or more leveling agents are used, at least one of the leveling agents is a polyaminoamide or a derivative thereof as described herein. It is preferred to use only one polyaminoamide leveling agent in the plating composition.

Further leveling agents can advantageously be used in the metal plating baths according to the present invention.

Suitable additional leveling agents include, but are not limited to, one or more of polyethylene imine and derivatives thereof, quaternized polyethylene imine, polyglycine, poly(allylamine), polyaniline, polyurea, polyacrylamide, poly(melamine-co-formaldehyde), reaction products of amines with epichlorohydrin, reaction products of an amine, epichlorohydrin, and polyalkylene oxide, reaction products of an amine with a polyepoxide, polyvinylpyridine, polyvinylimidazole as described e.g. in WO11151785 A1, polyvinylpyrrolidone, polyaminoamides as described e.g. in WO11064154A2 and WO14072885 A2, or copolymers thereof, nigrosines, pentamethyl-pararosaniline hydrohalide, hexamethyl-pararosaniline hydrohalide, di- or trialkanolamines and their derivatives as described in WO 2010/069810, and biguanides as described in WO12085811 A1.

Furthermore a compound containing a functional group of the formula $N-R^{41}-S$ may be used as a leveling agents, where $R^{41}$ is a substituted alkyl, unsubstituted alkyl, substituted aryl or unsubstituted aryl. Typically, the alkyl groups are $(C_1-C_6)$alkyl and preferably $(C_1-C_4)$alkyl. In general, the aryl groups include $(C_6-C_{20})$aryl, preferably $(C_6-C_{10})$aryl. Such aryl groups may further include heteroatoms, such as sulfur, nitrogen and oxygen. It is preferred that the aryl group is phenyl or napthyl. The compounds containing a functional group of the formula $N-R^{41}-S$ are generally known, are generally commercially available and may be used without further purification. In such compounds containing the $N-R^{41}-S$ functional group, the sulfur ("S") and/or the nitrogen ("N") may be attached to such compounds with single or double bonds. When the sulfur is attached to such compounds with a single bond, the sulfur will have another substituent group, such as but not limited to hydrogen, $(C_1-C_{12})$alkyl, $(C_2-C_{12})$alkenyl, $(C_6-C_{20})$aryl, $(C_1-C_{12})$alkylthio, $(C_2-C_{12})$alkenylthio, $(C_6-C_{20})$arylthio and the like. Likewise, the nitrogen will have one or more substituent groups, such as but not limited to hydrogen, $(C_1-C_{12})$alkyl, $(C_2-C_{12})$alkenyl, $(C_7-C_{10})$aryl, and the like. The $N-R^{41}-S$ functional group may be acyclic or cyclic. Compounds containing cyclic $N-R^{41}-S$ functional groups include those having either the nitrogen or the sulfur or both the nitrogen and the sulfur within the ring system.

A large variety of further additives may typically be used in the bath to provide desired surface finishes for the Cu plated metal. Usually more than one additive is used with each additive forming a desired function. Advantageously, the electroplating baths may contain one or more of accelerators, suppressors, sources of halide ions, grain refiners and mixtures thereof. Most preferably the electroplating bath contains both, an accelerator and a suppressor in addition to the leveling agent according to the present invention. Other additives may also be suitably used in the present electroplating baths.

Process

According to one embodiment of the present invention a metal plating bath comprising a composition as described above is used for depositing the metal on substrates comprising features having an aperture size of 30 nanometers or less.

A further embodiment of the present invention is a process for depositing a metal layer on a substrate by
a) contacting a metal plating bath comprising a composition according to the present invention with the substrate, and
b) applying a potential to the substrate for a time sufficient to deposit a metal layer onto the substrate,
wherein the substrate comprises micrometer or nanometer sized recessed features and the deposition is performed to fill the micrometer or nanometer sized recessed features.

The present invention is useful for depositing a metal layer, particularly a copper layer, on a variety of substrates, particularly those having submicron and variously sized apertures. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

Preferably the substrate comprises submicrometer sized features and the deposition is performed to fill the submicrometer sized features. Most preferably the submicrometer-sized features have an (effective) aperture size from 1 to 30 nanometers and/or an aspect ratio of 4 or more. More preferably the features have an aperture size of 25 nanometers or below, most preferably of 20 nanometers or below.

The leveling agents are particularly useful in filling features of different sizes. The metal layers provided by the present invention are substantially planar, even on substrates exhibiting apertures of a very wide range of different aperture sizes. In a preferred embodiment, the substrate comprises at least two features of different aperture size of (a) from 1 to 60 nm and (b) from 60 to 2000 nm. I another embodiment, the substrate comprises at least two features of different aperture size of (a) from 1 to 30 nm and (b) from 30 to 1000 nm. In yet another embodiment, the substrate comprises at least two features of different aperture size of (a) from 1 to 100 nm and (b) from 100 to 2000 nm.

As used herein, "feature" or "recessed feature" refers to recessed geometries on a substrate, such as, but not limited to, trenches and vias. "Aperture" refers to the opening of the features, such as vias and trenches. As used herein, the term "plating" refers to metal electroplating, unless the context clearly indicates otherwise. "Deposition" and "plating" are used interchangeably throughout this specification.

The "aperture size" according to the present invention means the smallest diameter or free distance of a feature before plating, i.e. after copper seed deposition. The terms "aperture" and "opening" are used herein synonymously. A convex shape is a feature having an aperture size being at least 25%, preferably 30%, most preferably 50% smaller than the biggest diameter or free distance of the feature before plating.

The agents/additives according to the present invention can further advantageously be used for electroplating of copper in through silicon vias (TSV). Such vias normally have diameters of several micrometers up to 100 micrometers and large aspect ratios of at least 4, sometimes above 10.

Furthermore the agents/additives according to the present invention can advantageously be used in bonding technologies such as the manufacture of copper pillars or tin or tin/silver solder bumps of typically 50 to 100 micrometers height and diameter for the bumping process, in circuit board technologies like the manufacture of high-density-interconnects on printed circuit boards using microvia plating or plated-through-hole technologies, or in other packaging processes for electronic circuits.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities include, but are not limited to, the range of 1 to 250 mA/cm$^2$. Typically, the current density is in the range of 1 to 60 mA/cm$^2$ when used to deposit copper in the manufacture of integrated circuits. The specific current density depends on the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

The metal, particularly copper, tin and cobalt, is deposited in apertures according to the present invention without substantially forming voids within the metal deposit. By the term "without substantially forming voids", it is meant that 95% of the plated apertures are void-free. It is preferred that 98% of the plated apertures are void-free, mostly preferred is that all plated apertures are void-free.

While the process of the present invention has been generally described with reference to semiconductor manufacture, it will be appreciated that the present invention may be useful in any electrolytic process where metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal or a metal containing layer to initiate plating thereon. A Cu seed layer may be applied by chemical vapor deposition (CVD), physical vapor deposition (PVD), atomic layer deposition (ALD) or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

Preferably the substrate comprises nanometer sized features and the deposition is performed to fill the micrometer or nanometer sized features, particularly those having an aperture size from 1 to 30 nm and/or an aspect ratio of 4 or more. Since the leveling agents according to the invention may be used in a very low concentration, they are particularly useful to ensure void-free filling of features having aperture sizes of 15 nm, particularly 10 nm or below and aspect ratios of 4 or more.

While the process of the present invention has been generally described with reference to semiconductor manufacture, it will be appreciated that the present invention may be useful in any electrolytic process where a substantially leveled and defect-free copper deposit is desired. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

The amine number was determined according to DIN 53176 by titration of a solution of the polymer in acetic acid with perchloric acid.

The acid number was determined according to DIN 53402 by titration of a solution of the polymer in water with aqueous sodium hydroxide solution.

The molecular weight ($M_w$) was determined by size exclusion chromatography using hexafluoroisopropanol containing 0.05% potassium trifluoroacetat as eluent, hexafluoroisopropanol-packed (HFIP) gel columns as stationary phase and polymethylmethacrylate (PMMA) standards for determination of the molecular weights.

A. Leveler Preparation

Example A1

N-(2-aminoethyl)piperazine (300 g) was placed into a 1000 mL four-necked flask under nitrogen atmosphere. Then water (90 g) was added dropwise over a period of 10 minutes. After that the mixture was heated up to 60° C. Subsequently adipic acid (321.4 g) was added over a period of 15 min and the mixture was heated up to 120° C. After 1 h stirring at 120° C. the reaction temperature was increased up to 180° C. and stirred for 3 h. Then, the temperature was decreased to 80° C. under dropwise water (301.5 g) addition over 10 minutes. To complete the reaction, the mixture post-react for 1 h at 80° C. Leveler A1 was obtained as a clear, yellow solution (2317 g).

Example A2

Methyl dipropylentriamine (24.2 g) and 1,4-bis (3 aminopropyl) piperazine (72.2 g) were placed into a 1000 mL four-necked flask under nitrogen atmosphere. Then water (20 g) was added dropwise over a period of 10 minutes. After that the mixture was heated up to 60° C. Subsequently adipic acid (73 g) was added over a period of 15 min and the mixture was heated up to 120° C. After 20 minutes the reaction temperature was increased up to 180° C. and stirred for 4 h. Then, the temperature was decreased to 80° C. under dropwise water (275 g) addition over 10 minutes. To complete the reaction, the mixture post-react for 1 h at 80° C. Leveler A2 was obtained as a clear, yellow solution (415 g).

Example A3

Dipropylentriamine (48.3 g) and 1,4-bis (3-aminopropyl) piperazine (33.4 g) were placed into a 1000 mL four-necked flask under nitrogen atmosphere. Then water (20 g) was added dropwise over a period of 10 minutes. After that the mixture was heated up to 60° C. Subsequently adipic acid (73 g) was added over a period of 15 min and the mixture was heated up to 120° C. After 1.5 h the reaction temperature was increased up to 180° C. and stirred for 3 h. Then, the temperature was decreased to 80° C. under dropwise water (275 g) addition over 10 minutes. To complete the reaction, the mixture post-react for 1.5 h at 80° C. Leveler A3 was obtained as a brown solution (382 g).

Example A4

Diethylenetriamine (37.2 g) and 1,4-bis (3-aminopropyl) piperazine (33.4 g) were placed into a 1000 mL four-necked flask under nitrogen atmosphere. Then water (20 g) was added dropwise over a period of 10 minutes. After that the mixture was heated up to 60° C. Subsequently adipic acid (73 g) was added over a period of 15 min and the mixture was heated up to 120° C. After 1 h the reaction temperature was increased up to 180° C. and stirred for 3 h. Then, the temperature was decreased to 80° C. under dropwise water (275 g) addition over 15 minutes. Leveler A4 was obtained as yellow solution (377 g).

Example A5

Diethylenetriamine (51.5 g) and N-(2-aminoethyl) piperazine (64.5 g) were placed into a 1000 mL four-necked flask under nitrogen atmosphere. Then water (40 g) was added dropwise over a period of 10 minutes. After that the mixture was heated up to 60° C. Subsequently adipic acid (138.3 g) was added over a period of 15 min and the mixture was heated up to 120° C. After 1 h the reaction temperature was increased up to 180° C. and stirred for 3 h. Then, the temperature was decreased to 80° C. under dropwise water (950 g) addition over 30 minutes. Leveler A5 was obtained as yellow solution (1138 g).

Example A6

Diethylenetriamine (80.1 g) and 1-4-bis (3-propylamino) piperazine (66.6 g) were placed into a 1000 mL four-necked flask under nitrogen atmosphere. Then water (40 g) was added dropwise over a period of 10 minutes. After that the mixture was heated up to 60° C. Subsequently adipic acid (146 g) was added over a period of 15 min and the mixture was heated up to 120° C. After 1 h the reaction temperature was increased up to 180° C. and stirred for 3 h. Then, the temperature was decreased to 80° C. under dropwise water (1000 g) addition over 30 minutes. Leveler A6 was obtained as yellow solution (1229 g).

Example A7

1-(3-aminopropyl) imidazole (187.8 g) was placed into a 1000 mL four-necked flask under nitrogen atmosphere. Then water (30 g) was added dropwise over a period of 10 minutes. After that the mixture was heated up to 60° C. Subsequently adipic acid (109.5 g) was added over a period of 15 min and the mixture was heated up to 120° C. After 1 h stirring at 120° C. the reaction temperature was increased up to 180° C. and stirred for 3 h. Then, the temperature was decreased to 80° C. under dropwise water (1000 g) addition over 10 minutes. The pre-step for leveller A7 was obtained as a clear, yellow solution (1245 g).

The pre-step (328 g) was placed into a 500 mL four-necked flask under nitrogen atmosphere and heated up to 65° C. Then Epichlorhydrin (14.8 g) was added over a period of 1 h. The reaction mixture was stirred 1 h more at 65° C. The completion of reaction conversion was controlled by negative preussmann test. Leveler A7 was obtained as yellow solution (318 g).

Example A8

Dipropylenetriamine (66.8 g) and N-(2-aminoethyl) piperazine (64.5 g) were placed into a 1000 mL four-necked flask under nitrogen atmosphere. Then water (40 g) was added dropwise over a period of 10 minutes. After that the mixture was heated up to 60° C. Subsequently adipic acid (138.3 g) was added over a period of 15 min and the mixture was heated up to 120° C. After 1 h the reaction temperature was increased up to 180° C. and stirred for 3 h. Then, the temperature was decreased to 80° C. under dropwise water (950 g) addition over 30 minutes. Leveler A8 was obtained as red-brown solution (1148 g).

Example A9

Diethylenetriamine (32.5 g) and N-(2-aminoethyl) piperazine (88.2 g) were placed into a 1000 mL four-necked flask under nitrogen atmosphere. Then water (40 g) was added dropwise over a period of 10 minutes. After that the mixture was heated up to 60° C. Subsequently adipic acid (138.3 g) was added over a period of 15 min and the mixture was heated up to 120° C. After 1 h the reaction temperature was increased up to 180° C. and stirred for 3 h. Then, the temperature was decreased to 80° C. under dropwise water (950 g) addition over 30 minutes. Leveler A9 was obtained as yellow solution (1010 g).

Example A10

Diethylenetriamine (16.3 g) and N-(2-aminoethyl) piperazine (108.6 g) were placed into a 1000 mL four-necked flask under nitrogen atmosphere. Then water (40 g) was added dropwise over a period of 10 minutes. After that the mixture was heated up to 60° C. Subsequently adipic acid (138.3 g) was added over a period of 15 min and the mixture was heated up to 120° C. After 1 h the reaction temperature was increased up to 180° C. and stirred for 3 h. Then, the temperature was decreased to 80° C. under dropwise water (910 g) addition over 30 minutes. Leveler A10 was obtained as yellow solution (1114 g).

Example A11

Methyl dipropylenetriamine (48.3 g) and N-(2-aminoethyl) piperazine (93.1 g) were placed into a 1000 mL four-necked flask under nitrogen atmosphere. Then water (40 g) was added dropwise over a period of 10 minutes. After that the mixture was heated up to 60° C. Subsequently adipic acid (146 g) was added over a period of 15 min and the mixture was heated up to 120° C. After 1 h the reaction temperature was increased up to 180° C. and stirred for 3 h. Then, the temperature was decreased to 80° C. under dropwise water (1000 g) addition over 30 minutes. Leveler A11 was obtained as orange coloured solution (1222 g).

B. Electroplating

For profilometry measurements copper deposition has been performed on wafer substrates exhibiting areas of different trench width ("3") and spacer width ("4") as shown in FIG. 1.

Four types of wafer substrates exhibiting different trench/spacer width pairings have been used. They are named A, B, C or D.

On substrate A the trench/spacer widths pairings "¾" investigated with profilometry had the average widths of (a) 100 nm/200 nm, (b) 30 nm/100 nm, (c) 50 nm/50 nm, (d) 30 nm/70 nm, (e) unpatterned area 1 and (f) unpatterned area 2 without any features.

On substrate B the trench/spacer widths pairings "¾" investigated with profilometry had the average widths of (a) 72 nm/72 nm, (b) 48 nm/48 nm and (c) 24 nm/24 nm.

On substrate C the trench/spacer widths pairings "¾" investigated with profilometry had the average widths of (a) 350 nm/250 nm, (b) 150 nm/150 nm, (c) 90 nm/90 nm, (d) 30 nm/30 nm and (e) an unpatterned area without any features.

On substrate D the trench/spacer widths pairings "¾" investigated with profilometry had the average widths of (a) 150 nm/150 nm, (b) 90 nm/90 nm, (c) 30 nm/30 nm and (d) an unpatterned area without any features.

Mounding of electroplated copper is indicated with a positive value in the profilometry measurement, and recessing of electroplated copper is indicated with a negative value in the profilometry measurement. A large absolute value obtained in the profilometry measurement means little leveling. Ideally, the absolute value obtained in the profilometry measurement is small meaning good leveling.

Comparative Example B1

A copper plating bath was prepared by combining 40 g/l copper as copper sulfate, 10 g/l sulfuric acid, 0.050 g/l chloride ion as HCl, 0.140 g/l of an EO/PO copolymer suppressor, and 0.028 g/l of SPS and DI water. The EO/PO copolymer suppressor had a molecular weight of below 8000 g/mole and terminal hydroxyl groups.

A copper layer was electroplated onto a silicon wafer containing areas with different trench/spacer pairings as described for substrate A. Such wafer substrates were brought into contact with the above described plating bath at 25 degrees C. and a direct current of $-3$ mA/cm$^2$ for 27 s followed by $-5$ mA/cm$^2$ for 27 s followed by $-10$ mA/cm$^2$ for 27 s and followed by $-40$ mA/cm$^2$ for 51 s was applied.

The thus electroplated copper layer was investigated by profilometry inspection. The altitude of deposited copper in the six areas was measured.

The results using a plating bath without a leveling agent are shown in Table 1.

Example B2

The procedure of the comparative example B1 was repeated except that 0.5 ml/l of an aqueous stock solution containing 1% by weight of the active leveling agent of example A1 was added to the plating bath.

A copper layer was electroplated onto a wafer substrate as described in the comparative example B1. The thus electroplated copper layer was investigated by profilometry as described above.

The profilometry results using a plating bath with a leveling agent according to example A1 are shown in Table 1. The profilometry cross-sectional scan shows a significant reduction of the mounding and recessing compared to comparative example B1 without leveler.

Comparative Example B3

A copper plating bath was prepared by combining 40 g/l copper as copper sulfate, 10 g/l sulfuric acid, 0.050 g/l chloride ion as HCl, 0.135 g/l of an EO/PO copolymer suppressor, and 0.028 g/l of SPS and DI water. The EO/PO copolymer suppressor had a molecular weight of below 8000 g/mole and terminal hydroxyl groups.

A copper layer was electroplated onto a silicon wafer containing areas with different trench/spacer pairings as described for substrate B in the beginning of this chapter. Such wafer substrates were brought into contact with the above described plating bath at 25 degrees C. and a direct current of −3 mA/cm² for 27 s followed by −5 mA/cm² for 27 s followed by −10 mA/cm² for 27 s and followed by −40 mA/cm² for 51 s was applied.

The thus electroplated copper layer was investigated by profilometry inspection. The altitude of deposited copper in the three areas was measured.

The results using a plating bath without a leveling agent are shown in Table 1.

Example B4

The procedure of comparative example B3 was repeated except that 0.5 ml/l of an aqueous stock solution containing 1% by weight of the active leveling agent of example A2 was added to the plating bath.

A copper layer was electroplated onto a wafer substrate as described in the comparative example B3. The thus electroplated copper layer was investigated by profilometry as described above.

The profilometry results using a plating bath with a leveling agent according to example A2 are shown in Table 1. The profilometry cross-sectional scan shows a significant reduction of the mounding and recessing compared to comparative example B3 without leveler.

Example B5

The procedure of the comparative example B3 was repeated except that 0.5 ml/l of an aqueous stock solution containing 1% by weight of the active leveling agent of example A3 was added to the plating bath.

A copper layer was electroplated onto a wafer substrate as described in the comparative example B3. The thus electroplated copper layer was investigated by profilometry as described above.

The profilometry results using a plating bath with a leveling agent according to example A3 are shown in Table 1. The profilometry cross-sectional scan shows a significant reduction of the mounding and recessing compared to the comparative example B3 without leveler.

Example B6

The procedure of the comparative example B1 was repeated except that 0.5 ml/l of an aqueous stock solution containing 1% by weight of the active leveling agent of example A4 was added to the plating bath.

A copper layer was electroplated onto a wafer substrate as described in the comparative example B1. The thus electroplated copper layer was investigated by profilometry as described above.

The profilometry results using a plating bath with a leveling agent according to example A4 are shown in Table 1. The profilometry cross-sectional scan shows a significant reduction of the mounding and recessing compared to comparative example B1 without leveler.

Comparative Example B7

A copper plating bath was prepared by combining 40 g/l copper as copper sulfate, 10 g/l sulfuric acid, 0.050 g/l chloride ion as HCl, 0.143 g/l of an EO/PO copolymer suppressor, and 0.028 g/l of SPS and DI water. The EO/PO copolymer suppressor had a molecular weight of below 8000 g/mole and terminal hydroxyl groups.

A copper layer was electroplated onto a silicon wafer containing areas with different trench/spacer pairings as described for substrate C in the beginning of this chapter. Such wafer substrates were brought into contact with the above described plating bath at 25 degrees C. and a direct current of −3 mA/cm² for 27 s followed by −5 mA/cm² for 27 s followed by −10 mA/cm² for 27 s and followed by −40 mA/cm² for 51 s was applied.

The thus electroplated copper layer was investigated by profilometry inspection. The altitude of deposited copper in the five areas was measured.

The results using a plating bath without a leveling agent are shown in Table 1.

Example B8

The procedure of comparative example B7 was repeated except that 0.5 ml/l of an aqueous stock solution containing 1% by weight of the active leveling agent of example A5 was added to the plating bath.

A copper layer was electroplated onto a wafer substrate as described in the comparative example B7). The thus electroplated copper layer was investigated by profilometry as described above.

The profilometry results using a plating bath with a leveling agent according to example A5 are shown in Table 1. The profilometry cross-sectional scan shows a significant reduction of the mounding and recessing compared to comparative example B7 without leveler.

Comparative Example B9

A copper plating bath was prepared by combining 40 g/l copper as copper sulfate, 10 g/l sulfuric acid, 0.050 g/l chloride ion as HCl, 0.143 g/l of an EO/PO copolymer suppressor, and 0.028 g/l of SPS and DI water. The EO/PO copolymer suppressor had a molecular weight of below 8000 g/mole and terminal hydroxyl groups.

A copper layer was electroplated onto a silicon wafer containing areas with different trench/spacer pairings as described for substrate D in the beginning of this chapter. Such wafer substrates were brought into contact with the above described plating bath at 25 degrees C. and a direct current of −3 mA/cm² for 27 s followed by −5 mA/cm² for 27 s followed by −10 mA/cm² for 27 s and followed by −40 mA/cm² for 51 s was applied.

The thus electroplated copper layer was investigated by profilometry inspection. The altitude of deposited copper in the four areas was measured.

The results using a plating bath without a leveling agent are shown in Table 1.

Example B10

The procedure of the comparative example B9 was repeated except that 0.5 ml/l of an aqueous stock solution containing 1% by weight of the active leveling agent of example A6 was added to the plating bath.

A copper layer was electroplated onto a wafer substrate as described in comparative example B9. The thus electroplated copper layer was investigated by profilometry as described above.

The profilometry results using a plating bath with a leveling agent according to example A6) are shown in Table 1. The profilometry cross-sectional scan shows a significant reduction of the mounding and recessing compared to example B9 without leveler.

Example B11

The procedure of comparative example B7 was repeated except that 0.5 ml/l of an aqueous stock solution containing 1% by weight of the active leveling agent of example A7 was added to the plating bath.

A copper layer was electroplated onto a wafer substrate as described in comparative example B7. The thus electroplated copper layer was investigated by profilometry as described above.

The profilometry results using a plating bath with a leveling agent according to example A7 are shown in Table 1. The profilometry cross-sectional scan shows a significant reduction of the mounding and recessing compared to comparative example B7 without leveler.

Example B12

The procedure of comparative example B7 was repeated except that 0.5 ml/l of an aqueous stock solution containing 1% by weight of the active leveling agent of example A8 was added to the plating bath.

A copper layer was electroplated onto a wafer substrate as described in comparative example B7. The thus electroplated copper layer was investigated by profilometry as described above.

The profilometry results using a plating bath with a leveling agent according to example A8 are shown in Table 1. The profilometry cross-sectional scan shows a significant reduction of the mounding and recessing compared to comparative example B7 without leveler.

Example B13

The procedure of the comparative example B7 was repeated except that 0.5 ml/l of an aqueous stock solution containing 1% by weight of the active leveling agent of example A9 was added to the plating bath.

A copper layer was electroplated onto a wafer substrate as described in comparative example B7. The thus electroplated copper layer was investigated by profilometry as described above.

The profilometry results using a plating bath with a leveling agent according to example A9 are shown in Table 1. The profilometry cross-sectional scan shows a significant reduction of the mounding and recessing compared to comparative example B7 without leveler.

Example B14

The procedure of the comparative example B7 was repeated except that 0.5 ml/l of an aqueous stock solution containing 1% by weight of the active leveling agent of example A10) was added to the plating bath.

A copper layer was electroplated onto a wafer substrate as described in comparative example B7. The thus electroplated copper layer was investigated by profilometry as described above.

The profilometry results using a plating bath with a leveling agent according to example A10 are shown in Table 1. The profilometry cross-sectional scan shows a significant reduction of the mounding and recessing compared to comparative example B7 without leveler.

Example B15

The procedure of the comparative example B9 was repeated except that 0.5 ml/l of an aqueous stock solution containing 1% by weight of the active leveling agent of example A11 was added to the plating bath.

A copper layer was electroplated onto a wafer substrate as described in comparative example B9. The thus electroplated copper layer was investigated by profilometry as described above.

The profilometry results using a plating bath with a leveling agent according to example A11 are shown in Table 1. The profilometry cross-sectional scan shows a significant reduction of the mounding and recessing compared to comparative example B9 without leveler.

TABLE 1

| Leveler | Substrate | Mounding over feature width of | | | | | |
| --- | --- | --- | --- | --- | --- | --- | --- |
| | | Area (a) | Area (b) | Area (c) | Area (d) | Area (e) | Area (f) |
| Comparative example B1 | A | −30 nm | 460 nm | 540 nm | 860 nm | −260 nm | −30 nm |
| Example B2 | A | 190 nm | −100 nm | −120 nm | −100 nm | −250 nm | −80 nm |
| Comparative example B3 | B | 100 nm | 370 nm | 10 nm | — | — | — |
| Example B4 | B | −20 nm | −5 nm | 5 nm | — | — | — |
| Example B5 | B | −40 nm | −10 nm | −25 nm | — | — | — |
| Example B6 | A | 120 nm | −30 nm | −40 nm | 20 nm | −220 nm | −30 nm |
| Comparative example B7 | C | −240 nm | −80 nm | 50 nm | 190 nm | −230 nm | — |
| Example B8 | C | 190 nm | 60 nm | −5 nm | 50 nm | 0 nm | — |
| Comparative example B9 | D | −20 nm | 130 nm | 470 nm | −180 nm | — | — |
| Example B10 | D | 5 nm | −10 nm | 140 nm | 30 nm | — | — |
| Example B11 | C | −10 nm | 20 nm | −30 nm | 60 nm | −40 nm | — |
| Example B12 | C | 0 nm | 80 nm | 40 nm | 105 nm | 0 nm | — |
| Example B13 | C | 0 nm | 65 nm | 50 nm | 100 nm | 0 nm | — |
| Example B14 | C | 0 nm | 40 nm | 30 nm | 90 nm | 0 nm | — |
| Example B15 | D | 165 nm | 30 nm | 40 nm | −50 nm | — | — |

The invention claimed is:

1. A composition, comprising a source of metal ions and one leveling agent selected from the group consisting of
(i) a polyaminoamide of formula Ia

$E^1\text{-}(A)_j\text{-}E^2$ (Ia)

or derivatives thereof obtainable by complete or partial protonation,
wherein
A is a polymer fragment of formula I,

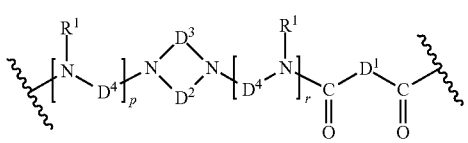

(I)

$D^1$ is selected from the group consisting of a chemical bond and a $C_1\text{-}C_{20}$-alkanediyl group,
$D^2$, $D^3$ are independently selected from the group consisting of $(CH_2)_m$,
$D^4$ is selected from the group consisting of a linear or branched $C_1\text{-}C_{12}$ alkanediyl, which may optionally be interrupted by O or S,
$E^1$, $E^2$ are independently selected from the group consisting of
(a) H or a nucleophilically displaceable leaving group X,
(b) $NH\text{---}C_1\text{-}C_{20}$-alkyl or $N\text{---}(C_1\text{-}C_{20}\text{-alkyl})_2$,
(c) $H\text{---}\{NH\text{-}[D^4\text{-}NR^1]_k\text{-}D^4\text{-}NH\}$ or $R^1\text{---}\{NR^1\text{-}[D^4\text{-}NR^1]_k\text{-}D^4\text{-}NH\}$, and
(d) $C_1\text{-}C_{20}\text{-alkyl-}CO\text{---}\{NH\text{-}[D^4\text{-}NR^1]_k\text{-}D^4\text{-}NH\}$, and
$R^1$ is selected from the group consisting of H and methyl, or
$E^1$, $E^2$ are independently selected from the group consisting of H, OH, alkoxy, halogen, $H\text{---}\{NH\text{-}[D^4\text{-}NR^1]_k\text{-}D^4\text{-}NH\}$ and $R^1\text{---}\{NR^1[D^4\text{-}NR^1]_k\text{-}D^4\text{-}NH\}$,
m is an integer from 1 to 6,
k is 1 or 2, and
j is an integer from 5 to 100,
and (ii) a polyaminoamide of formula Ib

$E^1\text{-}(A_gB_h)\text{-}E^2$ (Ib)

or derivatives thereof obtainable by complete or partial protonation,
wherein
$A_g$ is the polymer fragment of formula I,
B is a polymer fragment of formula II

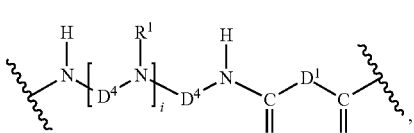

(II)

$D^1$ is selected from the group consisting of a chemical bond or a divalent group selected from the group consisting of $C_1\text{-}C_{20}$-alkanediyl which may optionally be interrupted by a double bond, an imino group or is optionally, completely or partially, a constituent of one or more saturated, unsaturated or aromatic carbocyclic or heterocyclic 5- to 8-membered rings, $D^2$, $D^3$ are (a) independently selected from the group consisting of linear or branched $C_1\text{-}C_{12}$ alkanediyl, which may optionally be interrupted by O, S and $NR^{10}$, or (b) both, together with the two N atoms, part of a 5- or 6-membered heteroaromatic ring system,
D4 is selected from the group consisting of a linear or branched $C_1\text{-}C_{12}$ alkanediyl, which may optionally be interrupted by O or S,
$E^1$, $E^2$ are independently selected from the group consisting of
(a) H or a nucleophilically displaceable leaving group X,
(b) $NH\text{---}C_1\text{-}C_{20}$-alkyl or $N\text{---}(C_1\text{-}C_{20}\text{-alkyl})_2$,
(c) $H\text{---}\{NH\text{-}[D^4\text{-}NR^1]_k\text{-}D^4\text{-}NH\}$ or $R^1\text{---}\{NR^1\text{-}[D^4\text{-}NR^1]_k\text{-}D^4\text{-}NH\}$, and
(d) $C_1\text{-}C_{20}\text{-alkyl-}CO\text{---}\{NH\text{-}[D^4\text{-}NR^1]_k\text{-}D^4\text{-}NH\}$, and
$R^1$ is, for each repeating unit 1 to p and r independently, selected from the group consisting of H, $\text{---}O\text{---}(CR^{11}R^{12}\text{---}O)_q\text{---}H$, $C_1\text{-}C_{12}$-alkyl, and $C_1$ to $C_{15}$ arylalkyl, which alkyl may optionally be substituted by hydroxy or $C_1$ to $C_{10}$ alkoxy,
$R^{10}$ is selected from the group consisting of H and $C_1\text{-}C_{12}$ alkyl, which may optionally be substituted by hydroxy and $C_1$ to $C_{10}$ alkoxy,
$R^{11}$, $R^{12}$ are each independently selected from the group consisting of H, $C_1\text{-}C_{10}$ alkyl and $\text{---}CH_2\text{---}O\text{---}R^{15}$,
$R^{15}$ is selected from the group consisting of H and $C_1\text{-}C_{10}$ alkyl,
p, r are independently integers from 0 to 10,
q is, if p or r is an integer from 1 to 6 and $R^1$ is $\text{---}O\text{---}(CR^{11}R^{12}\text{---}O)_q\text{---}H$, an integer selected so that an average degree of alkoxylation is from 0.01 to 5,
g, h are integers from 1 to 250,
k is an integer from 1 to 10, and
i is an integer from 0 to 10.

2. The composition of claim 1, wherein the metal ions comprise a copper ion.

3. The composition of claim 1, wherein the leveling agent is a polyaminoamide of formula 1b and $D^2$ and $D^3$ are independently selected from the group consisting of linear or branched $C_1\text{-}C_8$ alkanediyl, which may optionally be interrupted by O and $NR^{10}$.

4. The composition of claim 1, wherein the leveling agent is a polyaminoamide of formula 1b and $D^2$ and $D^3$ together with the two N atoms form an imidazole ring.

5. The composition of claim 1, wherein the leveling agent is a polyaminoamide of formula 1b and p or r is an integer from 1 to 6 and $R^1$ is selected from the group consisting of H and $C_1$ to $C_4$ alkyl.

6. The composition of claim 1, wherein the leveling agent is a polyaminoamide of formula 1b and p or r is an integer from 1 to 6 and $D^4$ is selected from the group consisting of $(CH_2)_g$, wherein g is an integer from 1 to 8.

7. The composition of claim 1, wherein the leveling agent is a polyaminoamide of formula 1b $D^1$ is selected from the group consisting of $C_1\text{-}C_{12}$-alkanediyl.

8. The composition of claim 1, wherein the leveling agent is a polyaminoamide of formula 1a and
$D^1$ is selected from the group consisting of a chemical bond and a $C_1\text{-}C_{20}$-alkanediyl group,
$D^2$, $D^3$ are independently selected from the group consisting of $(CH_2)_m$,
$R^1$ is selected from the group consisting of H and methyl,
$E^1$, $E^2$ are independently selected from the group consisting of H, OH, alkoxy, halogen, $H\text{---}\{NH\text{-}[D^4\text{-}NR^1]_k\text{-}D^4\text{-}NH\}$ and $R^1\text{---}\{NR^1\text{-}[D^4\text{-}NR^1]_k\text{-}D^4\text{-}NH\}$,
m is an integer from 1 to 6,
k is 1 or 2, and
j, g, h are integers from 5 to 100.

9. The composition of claim 1, wherein the leveling agent is obtained by reacting at least one polyalkylenepolyamine with at least one dicarboxylic acid.

10. The composition of claim 9, wherein the at least one polyalkylenepolyamine is selected from the group consisting of 1,4-bis (3 aminopropyl) piperazine, N-(2-aminoethyl) piperazine, 1-(3-aminopropyl) imidazole, mixtures thereof, and mixtures with non-cyclic polyalkylenepolyamines having at least 3 amino groups.

11. The composition of claim 9, wherein the at least one dicarboxylic acid is selected from the group consisting of oxalic acid, malonic acid, succinic acid, tartaric acid, maleic acid, itaconic acid, glutaric acid, adipic acid, suberic acid, sebacic acid, phthalic acid and terephthalic acid, iminodiacetic acid, aspartic acid, glutamic acid, and mixtures thereof.

12. The composition of claim 1, further comprising an accelerating agent comprising one or more sulfur atoms and a sulfonic/phosphonic acid or salt thereof.

13. A method of depositing copper on a semiconductor substrate comprising features having an aperture size of 1 to 30 nm, the method comprising contacting the semiconductor substrate with a leveling agent comprising at least one polyaminoamide comprising a polymer fragment of formula I

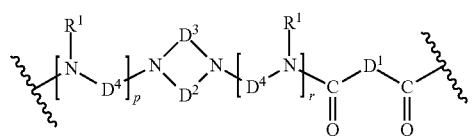

or derivatives thereof obtainable by complete or partial protonation,
wherein
$D^1$ is selected from a chemical bond or a divalent group selected from $C_1$-$C_{20}$-alkanediyl which may optionally be interrupted by a double bond, an imino group or is optionally, completely or partially, a constituent of one or more saturated or unsaturated carbocyclic 5- to 8-membered rings,
$D^2$, $D^3$ are (a) independently selected from linear or branched $C_1$-$C_{12}$ alkanediyl, which may optionally be interrupted by O, S and $NR^{10}$, or (b) both, together with the two N atoms, part of a 5 or 6-membered aromatic ring system,
$D^4$ is selected from a linear or branched $C_1$-$C_{12}$ alkanediyl, which may optionally be interrupted by O or S,
$R^1$ is, for each repeating unit 1 to p and r independently, selected from H, —O—$(CR^{11}R^{12}$—O$)_q$—H, $C_1$-$C_{12}$-alkyl, and $C_1$ to $C_{15}$ arylalkyl, which alkyl may optionally be substituted by hydroxy or $C_1$ to $C_{10}$ alkoxy,
$R^{10}$ is selected from H and $C_1$-$C_{12}$ alkyl, which may optionally be substituted by hydroxy and $C_1$ to $C_{10}$ alkoxy,
$R^{11}$, $R^{12}$ are each independently selected from H, $C_1$-$C_{10}$ alkyl and —$CH_2$—O—$R^{15}$,
$R^{15}$ is selected from H and $C_1$-$C_{10}$ alkyl,
p, r are independently integers from 0 to 10, and p or r is an integer from 1 to 6, and
q is, if $R^1$ is —O—$(CR^{11}R^{12}$—O$)_q$—H, an integer selected so that an average degree of alkoxylation is from 0.01 to 5.

14. A process for depositing a metal layer on a substrate comprising nanometer-sized recessed features, the process comprising:
a) contacting a composition comprising at least one polyaminoamide comprising a polymer fragment of formula I

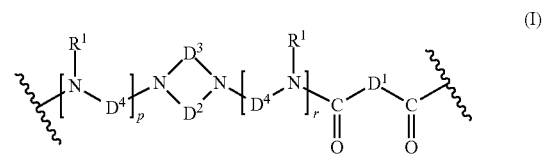

or derivatives thereof obtainable by complete or partial protonation with the substrate, and
b) applying a current density to the substrate for a time sufficient to deposit a metal layer onto the substrate,
wherein the substrate comprises nanometer-sized recessed features and the deposition is performed to fill micrometer- or nanometer-sized features,
wherein the substrate comprises recessed features having an aperture size of from 1 to 30 nm, and
wherein
$D^1$ is selected from a chemical bond or a divalent group selected from $C_1$-$C_{20}$-alkanediyl which may optionally be interrupted by a double bond, an imino group or is optionally, completely or partially, a constituent of one or more saturated, unsaturated or aromatic carbocyclic or heterocyclic 5- to 8-membered rings,
$D^2$, $D^3$ are (a) independently selected from linear or branched $C_1$-$C_{12}$ alkanediyl, which may optionally be interrupted by O, S and $NR^{10}$, or (b) both, together with the two N atoms, part of a 5 or 6-membered heteroaromatic ring system,
$D^4$ is selected from a linear or branched $C_1$-$C_{12}$ alkanediyl, which may optionally be interrupted by O or S,
$R^1$ is, for each repeating unit 1 to p and r independently, selected from H, —O—$(cR^{11}R^{12}$—O$)_q$—H, $C_1$-$C_{12}$-alkyl, and $C_1$ to $C_{15}$ arylalkyl, which alkyl may optionally be substituted by hydroxy or $C_1$ to $C_{10}$ alkoxy,
$R^{10}$ is selected from H and $C_1$-$C_{12}$ alkyl, which may optionally be substituted by hydroxy and $C_1$ to $C_{10}$ alkoxy,
$R^{11}$, $R^{12}$ are each independently selected from H, $C_1$-$C_{10}$ alkyl and —$CH_2$—O—$R^{15}$,
$R^{15}$ is selected from H and $C_1$-$C_{10}$ alkyl,
p, r are independently integers from 0 to 10, and p or r is an integer from 1 to 6, and
q is, if $R^1$ is —O—$(CR^{11}R^{12}$—O$)_q$—H, an integer selected so that an average degree of alkoxylation is from 0.01 to 5.

15. The process of claim 14, wherein the deposition is performed to fill the nanometer-sized recessed features.

16. The process of claim 15, wherein the nanometer-sized recessed features have an aspect ratio of 4 or more.

17. The process of claim 14, wherein the substrate comprises at least two features of different aperture size of (a) from 1 to 60 nm and (b) from 60 to 2000 nm.

* * * * *